US012616029B2

(12) United States Patent
Yang et al.

(10) Patent No.: US 12,616,029 B2
(45) Date of Patent: Apr. 28, 2026

(54) PACKAGE STRUCTURE WITH STIFFENER RING HAVING SLANT SIDEWALL

(71) Applicant: Taiwan Semiconductor Manufacturing Company, Ltd., Hsinchu (TW)

(72) Inventors: Che-Chia Yang, Taipei (TW); Shu-Shen Yeh, Taoyuan (TW); Li-Ling Liao, Hsinchu (TW); Chin-Hua Wang, New Taipei (TW); Po-Yao Lin, Hsinchu County (TW); Shin-Puu Jeng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 689 days.

(21) Appl. No.: 17/458,568

(22) Filed: Aug. 27, 2021

(65) Prior Publication Data

US 2023/0063295 A1     Mar. 2, 2023

(51) Int. Cl.
| | |
|---|---|
| *H01L 23/00* | (2006.01) |
| *H01L 23/04* | (2006.01) |
| *H01L 23/36* | (2006.01) |
| *H01L 25/18* | (2023.01) |

(52) U.S. Cl.
CPC ............ *H01L 23/562* (2013.01); *H01L 23/04* (2013.01); *H01L 23/36* (2013.01); *H01L 25/18* (2013.01)

(58) Field of Classification Search
CPC .............. H05K 7/1488; B65D 19/0038; B65D 2519/00024; H01L 23/562; H01L 23/04; H01L 23/36; H01L 25/18
See application file for complete search history.

(56) References Cited

U.S. PATENT DOCUMENTS

| | | | |
|---|---|---|---|
| 6,214,640 B1 | 4/2001 | Fosberry et al. | |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 10,840,192 B1 * | 11/2020 | Zohni | H01L 21/52 |
| 2006/0043553 A1 | 3/2006 | Yang et al. | |
| 2009/0050908 A1 * | 2/2009 | Yuan | F21K 9/00 257/E33.045 |

(Continued)

OTHER PUBLICATIONS

"Office Action of Taiwan Counterpart Application", issued on Nov. 14, 2022, p. 1-p. 6.

*Primary Examiner* — Benjamin Tzu-Hung Liu
(74) *Attorney, Agent, or Firm* — JCIPRNET

(57) ABSTRACT

Provided are a package structure and a method of forming the same. The package structure includes a package substrate, a first die, and a stiffener ring. The first die is disposed on the package substrate and has a first sidewall and a second sidewall opposite to each other. The stiffener ring is disposed on the package substrate to surround the first die. The stiffener ring has an inner sidewall facing the first die, and the inner sidewall at least has a slant sidewall facing the first sidewall of the first die.

20 Claims, 12 Drawing Sheets

(56)  References Cited

U.S. PATENT DOCUMENTS

2017/0373045  A1*  12/2017  Welch ..................... H01L 33/60
2020/0411448  A1*  12/2020  Goh ...................... H01L 23/552
2021/0257272  A1*   8/2021  Kothari .............. H01L 23/3736
2021/0366861  A1*  11/2021  Chen ........................ H01L 23/16
2022/0310890  A1*   9/2022  Hansen ................ H10F 77/413

* cited by examiner

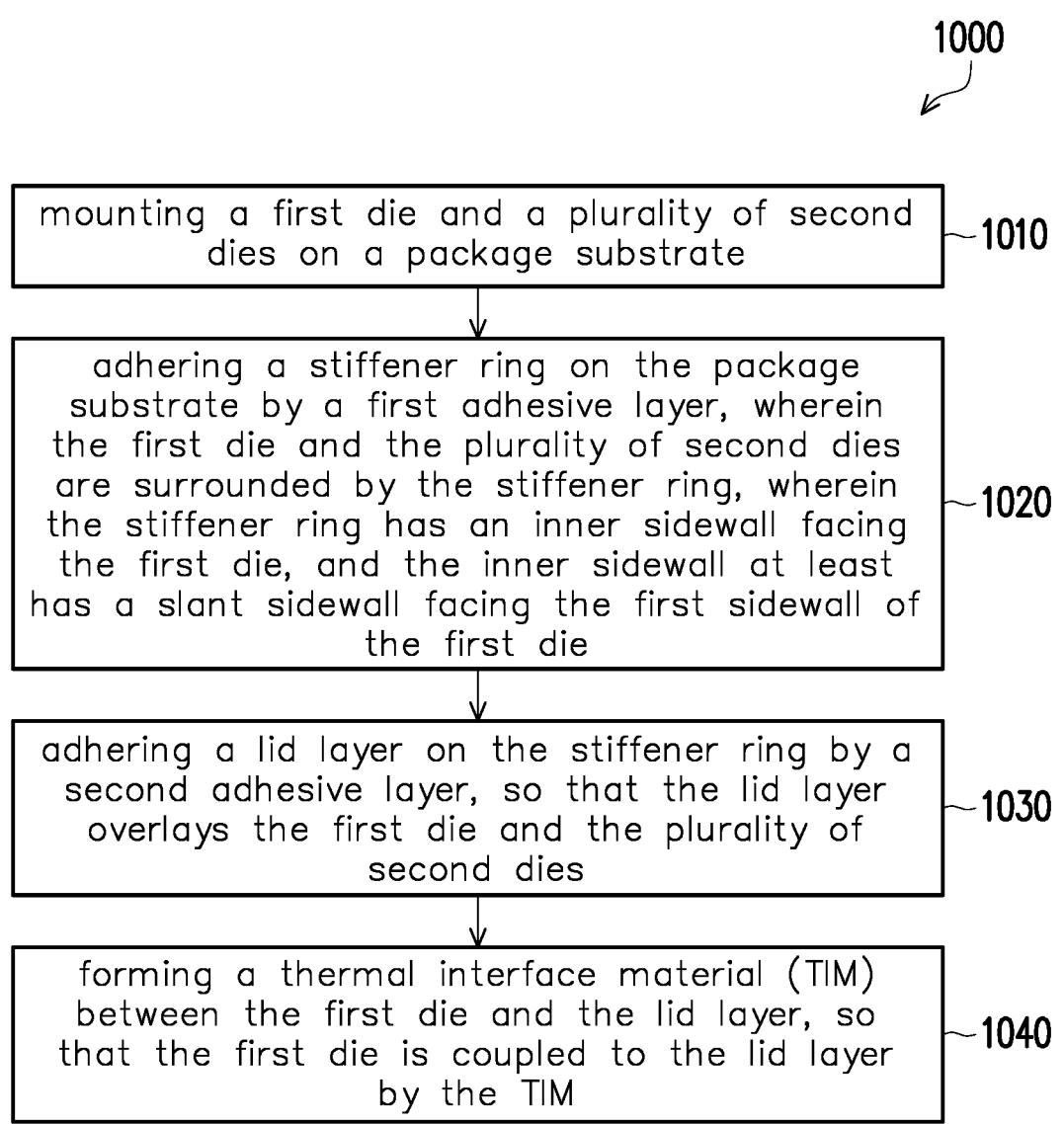

1000 mounting a first die and a plurality of second dies on a package substrate ～1010 adhering a stiffener ring on the package substrate by a first adhesive layer, wherein the first die and the plurality of second dies are surrounded by the stiffener ring, wherein the stiffener ring has an inner sidewall facing the first die, and the inner sidewall at least has a slant sidewall facing the first sidewall of the first die ～1020 adhering a lid layer on the stiffener ring by a second adhesive layer, so that the lid layer overlays the first die and the plurality of second dies ～1030 forming a thermal interface material (TIM) between the first die and the lid layer, so that the first die is coupled to the lid layer by the TIM ～1040

FIG. 18

PACKAGE STRUCTURE WITH STIFFENER RING HAVING SLANT SIDEWALL

BACKGROUND

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows more of the smaller components to be integrated into a given area. These smaller electronic components also demand smaller packages that utilize less area than previous packages. Some smaller types of packages for semiconductor components include quad flat packages (QFPs), pin grid array (PGA) packages, ball grid array (BGA) packages, flip chips (FC), three-dimensional integrated circuits (3DICs), wafer level packages (WLPs), and package on package (PoP) devices and so on.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 18 illustrates a flowchart of a method for forming a package structure in accordance with some embodiments.

DETAILED DESCRIPTION

Figure 1:
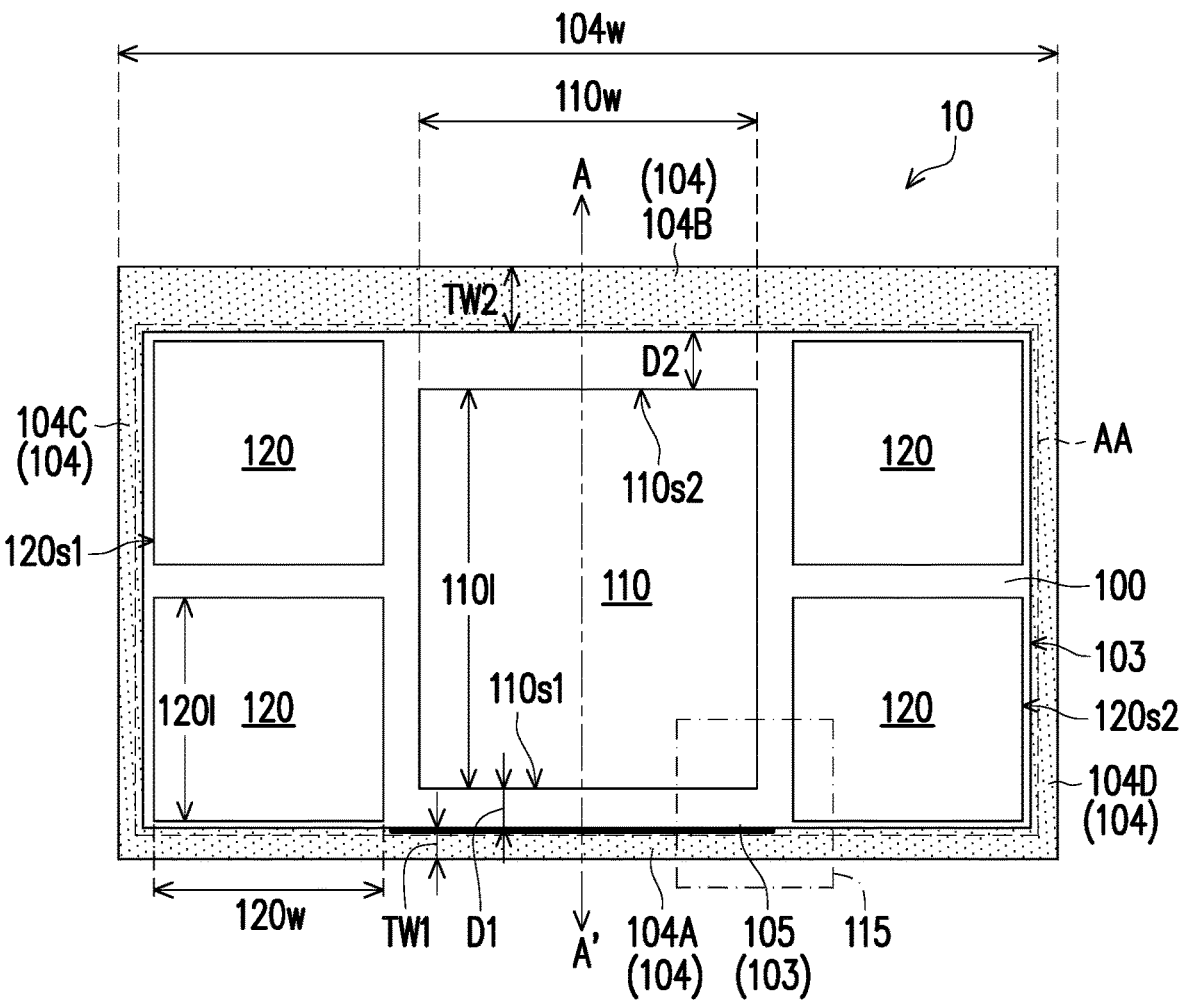
FIG. 1 is a top view showing a package structure in accordance with a first embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In the semiconductor package industry, a chip having an integrated circuit is commonly mounted on a package substrate such as an interposer, a circuit board or a lead frame that provides electrical connections from the chip to the exterior of the package structure. In such packaging arrangement called flip chip mounting, where an active surface of the chip is mounted in an upside-down manner on the substrate, the chip and the substrate are usually formed of different materials having mismatched coefficients of thermal expansion (CTE). As a result, the chip and the substrate experience significantly different dimension changes when heated, and the mismatch in dimension changes causes significant thermally-induced stresses and warpage in the electrical connections between the chip and the substrate. If uncompensated, the disparity in thermal expansion can result in degradation in the performance of the chip, damage to the solder connections between the chip and the substrate, or package failure.

To reduce warpage and improve the reliability of flip chip packages, a number of approaches have been offered by the microelectronics industry. A stiffener is typically employed around the chip in the package assembly. The stiffener is attached on the substrate and surround the chip to constrain the substrate in order to prevent chip warpage or other movement relative to the chip during thermal cycling. To further reduce the chance of warpage and promote thermal cooling of flip chip packages, a lid or heat spreader is often mounted on top of the package to dissipate heat and counterbalance the forces exerted by the thermal expansion mismatches between at least the chip and the substrate.

With the diversification of electronic products, the chip in the package may be arranged at any position on the substrate to accommodate more components, such as capacitors, resistors, inductors, or any suitable passive components. When the chip is offset from a center of the substrate to approach one side of the stiffener to make more room for the passive components, the thermally-induced stress will focus on the side of the stiffener close to the chip. In this case, the stress due to the CTE mismatch between the chip and the lid may cause the delamination or crack issue of the adhesive coupled between the stiffener and the lid, thereby affecting the reliability of the package structure.

In accordance with some embodiments, a stiffener ring is disposed on a package substrate to surround a first die. The stiffener ring may include a first portion with a slant sidewall facing the first sidewall of the first die, so that the first portion has a top area less than a bottom area thereof. That is, the second adhesive layer between the top of the first portion of the stiffener ring and the lid layer has an area less than an area of the first adhesive layer between the bottom of the first portion of the stiffener ring and the package substrate. In this case, the thermally-induced stress forced on the second adhesive layer between the stiffener ring and the lid layer is able to effectively reduced, thereby avoiding the crack and/or delamination issue of the second adhesive layer and enhancing the reliability of the package structure.

Figure 2A:
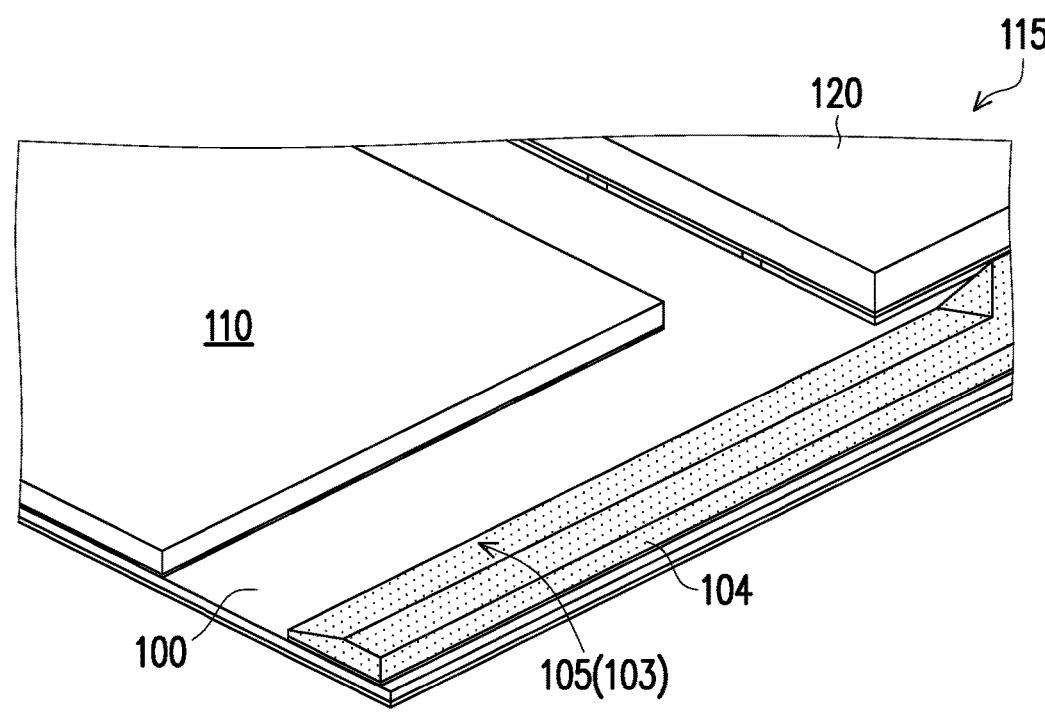
FIG. 2A is a perspective view showing a region of FIG. 1.
Figure 2B:
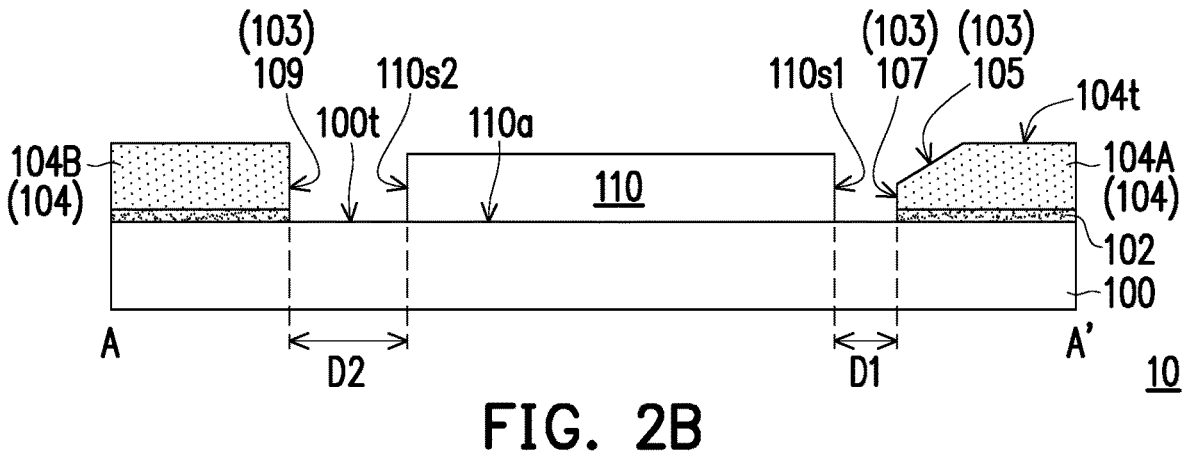
FIG. 2B is a cross-sectional view along a cross-section A-A' of FIG. 1.

FIG. 1 is a top view showing a package structure in accordance with a first embodiment. FIG. 2A is a perspective view showing a region 115 of FIG. 1. FIG. 2B is a cross-sectional view along a cross-section A-A' of FIG. 1.

Referring to FIG. 1, FIG. 2A, and FIG. 2B, a package structure 10 includes a substrate 100, a first adhesive layer 102, a stiffener ring 104, a first die 110, and a plurality of second dies 120. In some embodiments, the substrate 100 includes a package substrate, a circuit substrate, or an interposer (hereinafter called "package substrate 100"). The package substrate 100 may include based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for package substrate 100.

The package substrate 100 may include active and passive devices (not shown). As one of ordinary skill in the art will recognize, a wide variety of devices such as transistors, capacitors, resistors, combinations of these, and the like may be used to provide structural and functional designs for the package structure 10. The devices may be formed using any suitable methods.

The package substrate 100 may also include metallization layers, vias, and bond pads over the metallization layers and vias (not shown). The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 100 is substantially free of active and passive devices.

As shown in FIG. 1, the first die 110 and the second dies 120 are mounted side by side on the package substrate 100. In detail, the first die 110 is disposed between the second dies 120. In some embodiments, the first die 110 and the second dies 120 may have different functions or sizes.

Herein, the term "size" is referred to the length, width, or area. For example, as shown in FIG. 1, a length 1101 and/or a width 110w of the first die 110 is greater than a length 1201 and/or a width 120w of one of the second dies 120. Although the detail components in the first die 110 is not illustrated in the cross-sectional view of FIG. 2B, the first die 110 is mounted onto the package substrate 100 by a flip-chip manner. That is, an active surface 110a of the first die 110 faces and is bonded on a top surface 100t of the package substrate 100.

In some embodiments, the first die 110 includes a system on a chip or system on chip (SoC) including several different integrated circuits, i.e. ICs or processors, together with memories and I/O interfaces. Each of the integrated circuit integrates various components of a computer or other electronic systems into one semiconductor chip. The various components contain digital, analog, mixed-signal, and often radio-frequency functions. Also, the SoC integrates processors (or controllers) with advanced peripherals like a graphics processing unit (GPU), a Wi-Fi module, or a co-processor. In the architecture of the SoC, both logic components and memory components are fabricated in the same silicon wafer. For high efficiency computing or mobile devices, multi-core processors are used, and the multi-core processors include large amounts of memories, such as several gigabytes. In some alternative embodiments, the first die 110 may be an application-specific integrated circuit (ASIC) die.

In some embodiments, one of the second dies 120 includes a memory die, such as high bandwidth memory (HBM) die, dynamic random-access memory (DRAM) die, static random-access memory (SRAM) die, or a combination thereof. Alternatively, one of the second dies 120 may include a chip scale package (CSP) with a memory function. In such embodiment, the second die 120 may be referred to as a package die. In other embodiments, one of the second dies 120 may include a logic die, such as a central processing unit (CPU) die, a graphic processing unit (GPU) die, a micro control unit (MCU) die, an input-output (I/O) die, a baseband (BB) die, or an application processor (AP) die. Although four second dies 120 is illustrated in FIG. 1 to surround one first die 110, the embodiments of the present disclosure are not limited thereto. In other embodiments, the number of the first die 110 and the second dies 120 are adjusted by the need. In some embodiments, the first die 110 and the second dies 120 have different coefficients of thermal expansion (CTE). The CTE of first die 110 is less than the CTE of the second dies 120. For example, the CTE of the first die 110 is in a range of 2.5 ppm/° C. to 3.5 ppm/° C., such as 3 ppm/° C., and the CTE of the second dies 120 is in a range of 8 ppm/° C. to 25 ppm/° C., such as 17 ppm/° C.

As shown in FIG. 2B, the first adhesive layer 102 is formed on the package substrate 100. In some embodiments, the first adhesive layer 102 includes any suitable adhesive, epoxy, die attach film (DAF), or the like. Alternatively, the first adhesive layer 102 may be a thermally conductive material.

Thereafter, the stiffener ring 104 is adhered on the package substrate 100 by the first adhesive layer 102. The stiffener ring 104 may be a rigid ring-like structure having substantially the same dimensions as the package substrate 100. In some embodiments, stiffener ring 104 are pre-fabricated and available from material suppliers. As shown in FIG. 1, the stiffener ring 104 has an inner sidewall (or inner perimeter) 103 facing and surrounding the first die 110 and the second dies 120. The inner sidewall 103 may enclose an accommodation area AA, and the first die 110 and the second dies 120 are disposed on the package substrate 100 within the accommodation area AA. In other words, the stiffener ring 104 may have a window in its center to expose the dies 110 and 120 and allow for the heat transfer. Noted that the stiffener ring 104 is attached on the package substrate 100 and surrounds the dies 110 and 120 to constrain the package substrate 100 in order to prevent its warpage or other movement relative to the first and second dies 110 and 120, which may be caused by thermal cycling during package assembly, reliability testing, or field operation. The warpage and stress in the dies or package may lead to die performance degradation or package failure.

In some embodiments, the stiffener ring 104 is formed of a rigid yet flexible material. In one exemplary embodiment, the stiffener ring 104 is formed from a metal material with high thermal conductivity (k), such as steel, stainless steel, copper, aluminum, copper tungsten, the like, or combinations thereof. In another embodiment, the stiffener ring 104 includes a ceramic material. In yet another embodiment, the stiffener ring 104 includes a silicon containing material. In yet another embodiment, the stiffener ring 104 includes a composite alloy. In yet another embodiment, the stiffener ring 104 includes a plastic material. In the present embodiment, the material of the stiffener ring 104 is typically selected to have a CTE the same as or sufficiently similar to the package substrate 100 in order to apply a counter force to the package substrate 100 and reduce the bow of the package structure 10 to within tolerances accepted in the industry. For example, the CTE of the stiffener ring 104 is smaller than 25 ppm/° C., such as 17 ppm/° C., and the CTE of the package substrate 100 is in a range of 8 ppm/° C. to 25 ppm/° C., such as 17 ppm/° C.

As shown in FIG. 1, the stiffener ring 104 may have a first portion 104A, a second portion 104B, a third portion 104C, and a fourth portion 104D. Specifically, the first portion 104A is adjacent to a first sidewall 110s1 of the first die 110, and the second portion 104B is adjacent to a second sidewall 110s2 of the first die 110 opposite to the first sidewall 110s1. In addition, the third portion 104C is adjacent to a first sidewall 120s1 of the second die 120 and connects the first portion 104A and the second portion 104B. The fourth portion 104D is adjacent to a second sidewall 120s2 of the second die 120 opposite to the first sidewall 120s1 and connects the first portion 104A and the second portion 104B. In the top view of FIG. 1, the first, second, third, and fourth portions 104A, 104B, 104C, and 104D are connected to form a rectangular ring structure. However, the embodiments of the present disclosure are not limited thereto. In other embodiments, the stiffener ring 104 may be various ring structures, such as a circular ring structure or a polygonal ring structure.

It should be noted that, in the present embodiment, the first die 110 is an eccentric die offset from a center of accommodation area AA to close to the first portion 104A of the stiffener ring 104, thereby making more room between the second sidewall 110s2 and the second portion 104B for accommodating more components, such as passive components. That is, a first distance D1 between the first sidewall 110s1 of the first die 110 and the first portion 104A is less than a second distance D2 between the second sidewall 110s2 of the first die 110 and the second portion 104B. In this case, the thermally-induced stress will focus on the first portion 104A of the stiffener ring 104 close to the first die 110. In order to solve the said localized stress concentration issue, in the present embodiment, the first portion 104A of the stiffener ring 104 (or the inner sidewall 103) has a slant sidewall (or inclined sidewall) 105 facing the first sidewall

110s1 of the first die 110, so as to reduce the rigidity of the first portion 104A of the stiffener ring 104 and increase the flexibility of the first portion 104A of the stiffener ring 104. Accordingly, the stress due to the CTE mismatch between the first die 110 (e.g., CTE=3 ppm/° C.) and the package substrate 100 (e.g., CTE=17 ppm/° C.) transmitted to the first portion 104A of the stiffener ring 104 can be effectively reduced, thereby avoiding the crack and/or delamination issue of the first adhesive layer 102. In some embodiments, the first portion 104A of the stiffener ring 104 has a first top width (or top area) TW1 less than a second top width (or top area) TW2 of the second portion 104B of the stiffener ring 104. However, the embodiments of the present disclosure are not limited thereto. In other embodiments, the first top width TW1 of the first portion 104A may be substantially equal to or greater than the second top width TW2 of the second portion 104B.

On the other hand, since the second distance D2 between the second sidewall 110s2 of the first die 110 and the second portion 104B is far enough, the second portion 104B of the stiffener ring 104 (or the inner sidewall 103) may maintain a vertical sidewall 109 facing the second sidewall 110s2 of the first die 110. In some embodiments, the first distance D1 is smaller than 5000 μm, the second distance D2 is smaller than 5000 μm, and a ratio (D1/D2) of the first distance D1 to the second distance D2 is in a range of 0 to 1. When the first distance D1 is smaller than D2, the crack and/or delamination issue of the first adhesive layer 102 may be occurred due to the stress concentration. In such embodiment, the first portion 104A of the stiffener ring 104 may have the slant sidewall 105 to avoid the crack and/or delamination issue of the first adhesive layer 102. As shown in FIG. 1 and FIG. 2A, the slant sidewall 105 is only formed on the first portion 104A of the stiffener ring 104 facing the first sidewall 110s1 of the first die 110. The length of the slant sidewall 105 is greater than or substantially equal to the width 110w of the first die 110. However, the embodiments of the present disclosure are not limited thereto. In some other embodiments, the length of the slant sidewall 105 may be less than the width 110w of the first die 110 or within a width 104w of the stiffener ring 104. By the way, since the CTE of the second dies 120 is sufficiently similar to the CTE of the stiffener ring 104, such as 17 ppm/° C., even if the distance between the second dies 120 and the stiffener ring 104 is less than the first distance D1, it will not cause the crack or delamination issue of the first adhesive layer 102.

Figure 3A:
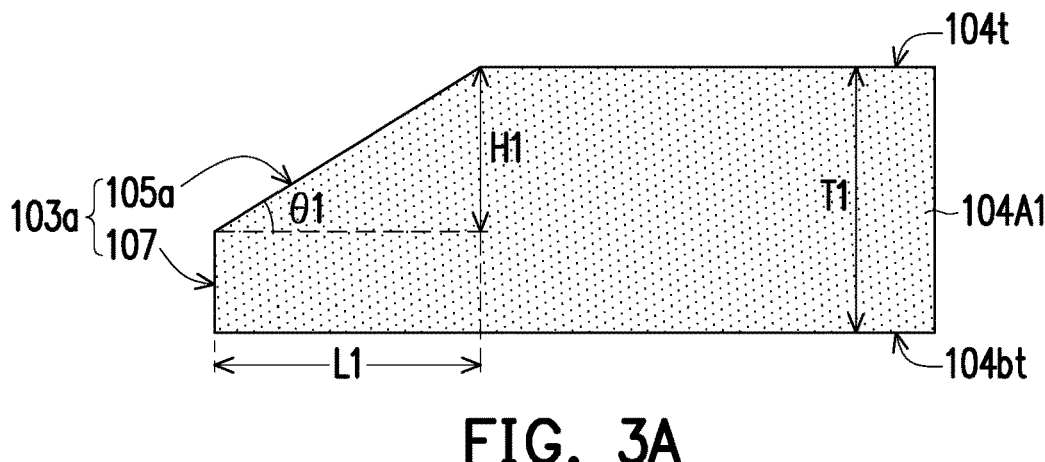
FIG. 3A to FIG. 3D are cross-sectional views showing a stiffener ring in accordance with various embodiments.
Figure 3B:
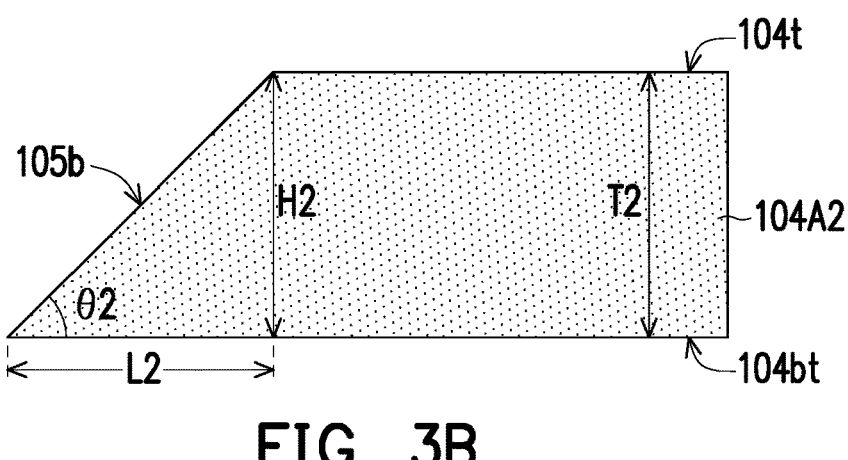
Figure 3C:
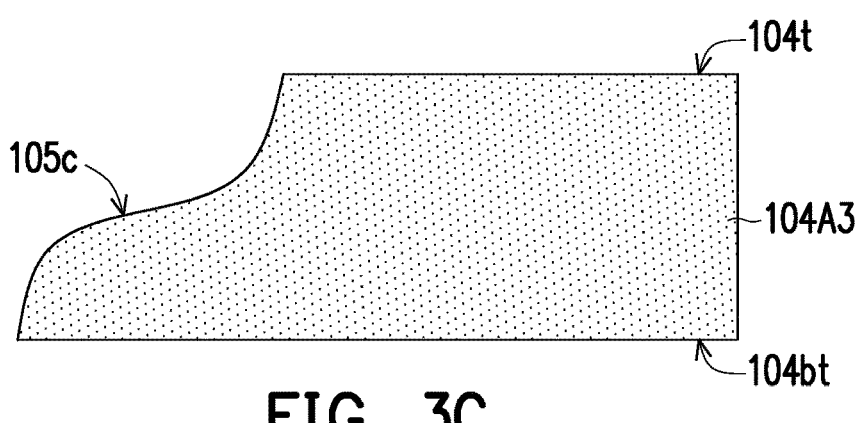
Figure 3D:
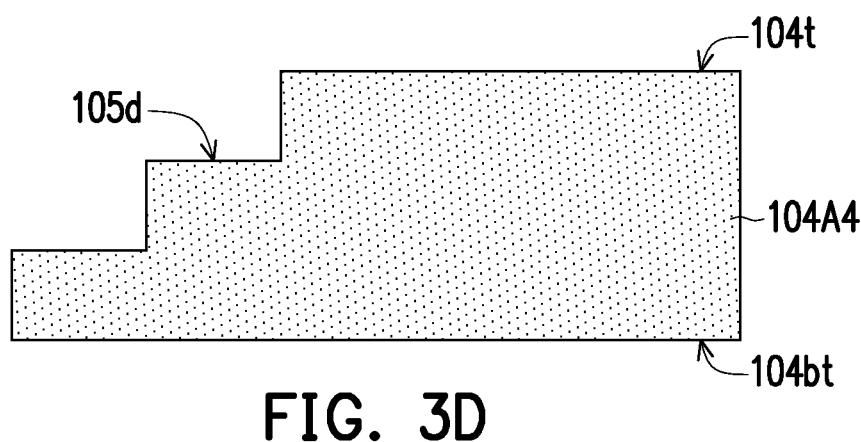
Figure 3E:
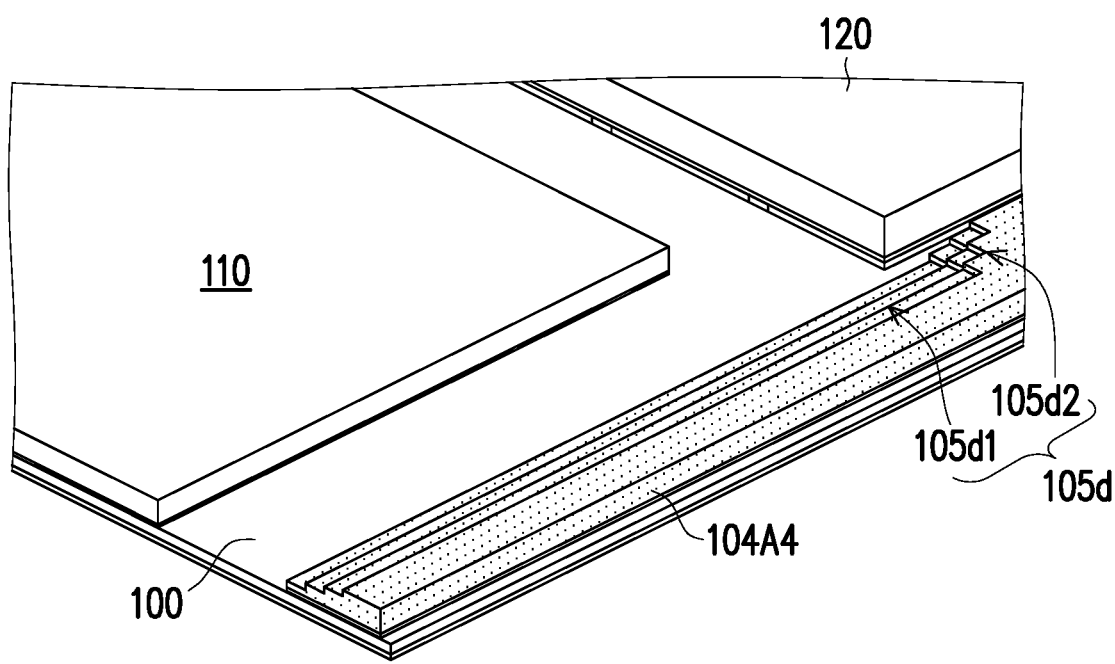
FIG. 3E is a perspective view showing a region of FIG. 3D.

In some embodiments, the first portion 104A of the stiffener ring 104 includes various shapes or profiles in the cross-sectional view, so as to avoid the crack or delamination issue of the first adhesive layer 102. In one exemplary embodiment, as shown in FIG. 3A, the first portion 104A1 may have a top surface 104t and a bottom surface 104bt opposite to each other. The inner sidewall 103a of the first portion 104A1 may have a slant sidewall 105a and a vertical sidewall 107. The vertical sidewall 107 is connected to the slant sidewall 105a and the bottom surface 104bt, and the slant sidewall 105a is connected to the vertical sidewall 107 and the top surface 104t. An angle θ1 between the slant sidewall 105a and the bottom surface 104bt is an acute angle. In some embodiments, the angle θ1 is in a range of 30 degree to 89.9 degree. A thickness T1 of the first portion 104A1 measured between the top surface 104t and the bottom surface 104bt may be smaller than 4000 μm, a height H1 of the slant sidewall 105a may be smaller than 4000 μm, and a length L1 of the slant sidewall 105a may be smaller than 4000 μm. In the embodiments, as shown in FIG. 3A, the height H1 of the slant sidewall 105a is less than the thickness T1 of the first portion 104A. In another embodiment, as shown in FIG. 3B, the first portion 104A2 may have a slant sidewall 105*b* connecting the top surface 104*t* and the bottom surface 104*bt*. In some embodiments, the angle θ2 is in a range of 45 degree to 89.9 degree. A thickness T2 of the first portion 104A2 measured between the top surface 104*t* and the bottom surface 104*bt* may be in a range of 0.1 µm to 4000 µm, a height H2 of the slant sidewall 105*b* may be in a range of 0.1 µm to 4000 µm, and a length L2 of the slant sidewall 105*b* may be in a range of 0.1 µm to 4000 µm. In the embodiments, as shown in FIG. 3B, the height H2 of the slant sidewall 105*b* is less than the thickness T2 of the first portion 104A2. Although the slant sidewall 105*a*/105*b* illustrated in FIGS. 3A and 3B is a flat surface, the embodiments of the present disclosure are not limited thereto. In some other embodiments, as shown in FIG. 3C, the first portion 104A3 may have a slant sidewall 105*c* connecting the top surface 104*t* and the bottom surface 104*bt*, and the slant sidewall 105*c* is a curved surface. In some other embodiments, as shown in FIG. 3D, the first portion 104A4 may have a slant sidewall 105*d* connecting the top surface 104*t* and the bottom surface 104*bt*, and the slant sidewall 105*d* is a staircase surface. In detail, as shown in a perspective view of FIG. 3E showing a region of FIG. 3D, the slant sidewall 105*d* may include a first staircase 105*d*1 along a first direction and a second staircase 105*d*2 along a second direction. The first staircase 105*d*1 may connect the second staircase 105*d*2. In some other embodiments, the first direction is perpendicular to the second direction. In addition, the number of the stairs of the slant sidewall 105*d* can be adjusted by the need.

Figure 4:
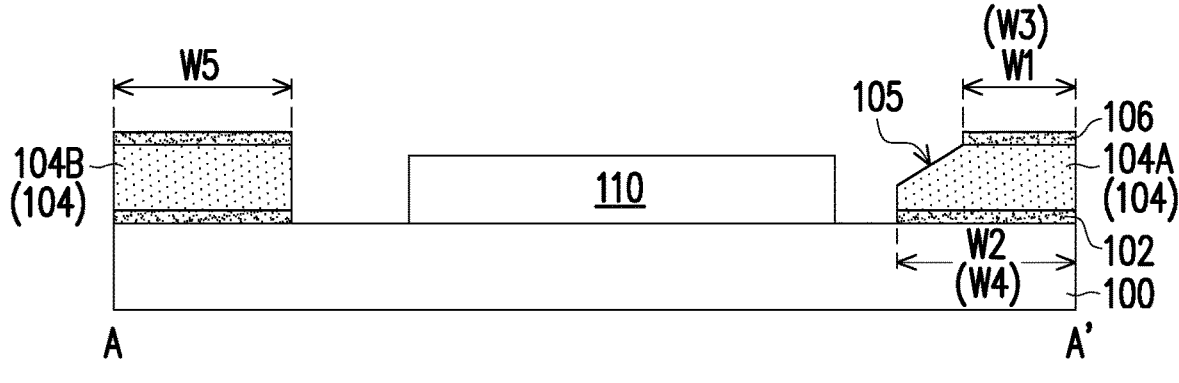
FIG. 4 and FIG. 5 are cross-sectional views of a method of forming a package structure having a lid layer in accordance with some embodiments.
Figure 5:
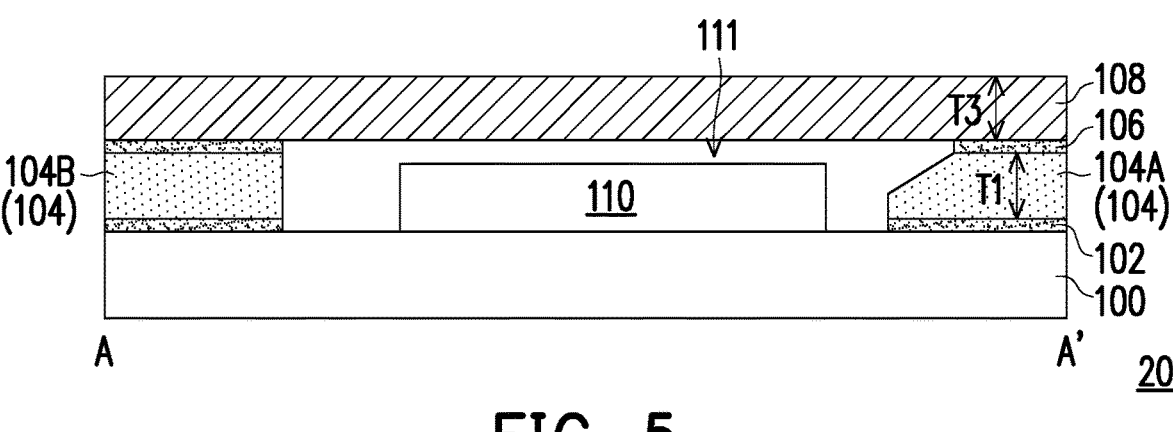

FIG. 4 and FIG. 5 are cross-sectional views of a method of forming a package structure having a lid layer in accordance with some embodiments.

Referring to FIG. 4, continued from FIG. 2B, after attaching the stiffener ring 104 on the package substrate 100 by the first adhesive layer 102, a second adhesive layer 106 is formed on the top surface 104*t* of the stiffener ring 104. The second adhesive layer 106 may include any suitable adhesive, epoxy, die attach film (DAF), or the like. Alternatively, the second adhesive layer 106 may be a thermally conductive material. In some embodiments, the first adhesive layer 102 and the second adhesive layer 106 have the same material or different materials. It should be noted that, in the present embodiment, since the first portion 104A of the stiffener ring 104 has the slant sidewall 105, a width (or area) W1 of the top surface 104*t* of the first portion 104A is less than a width (or area) W2 of the bottom surface 104*bt* of the first portion 104A. In this case, the second adhesive layer 106 on the first portion 104A may have a width (or area) W3 is less than a width (or area) W4 of the first adhesive layer 102 between the first portion 104A and the package substrate 100. In some embodiments, the width W1 is substantially equal to the width W3, and the width W2 is substantially equal to the width W4. On the other hand, the second portion 104B, the second adhesive layer 106 on the second portion 104B, and the first adhesive layer 102 between the second portion 104B and the package substrate 100 may have the same width (or area) W5.

Referring to FIG. 5, a lid layer 108 is adhered on the stiffener ring 104 by the second adhesive layer 106 to form a package structure 20. The lid layer 108 may be coupled to the stiffener ring 104 to increase the rigid of the stiffener ring 104, thereby reducing the warpage of the package structure 20. In addition, the lid layer 108 may overlay the first die 110 and the second dies 120 to prevent the electromagnetic interference (EMI). A gap 111 may be formed between the lid layer 108 and the first die 110. In some embodiments, the lid layer 108 is formed from a metal material with high thermal conductivity (k), such as steel, stainless steel, copper, aluminum, copper tungsten, the like, or combinations thereof. In another embodiment, the lid layer 108 includes a ceramic material. In yet another embodiment, the lid layer 108 includes a silicon containing material. In yet another embodiment, the lid layer 108 includes a composite alloy. In yet another embodiment, the lid layer 108 includes a plastic material. In some other embodiments, the lid layer 108 is a single contiguous material. In another embodiment, the lid layer 108 includes multiple pieces that may be the same or different materials. In the present embodiment, the lid layer 108 and the stiffener ring 104 have the same material with the same CTE to avoid the stress due to the CTE mismatch. In some embodiments, the lid layer 108 has a thickness T3 in a range of 0.1 µm to 4000 µm. The thickness T3 of the lid layer 108 may be greater than, substantially equal to, or less than the thickness T1 of the stiffener ring 104.

It should be noted that when the first portion 104A of the stiffener ring 104 is close to the first die 110 than the second portion 104B of the stiffener ring 104, the stress induced by the CTE mismatch between the first die 110 and the package substrate 100 will focus on the first portion 104A of the stiffener ring 104. In order to solve the said localized stress concentration issue, in the present embodiment, the first portion 104A of the stiffener ring 104 has the slant sidewall 105 facing the first sidewall 110*s*1 of the first die 110, so as to reduce the coupling area between the first portion 104A of the stiffener ring 104 and the lid layer 108, thereby avoiding the crack and/or delamination issue of the second adhesive layer 106. Accordingly, the reliability and the yield of the package structure 20 is improved.

Figure 6:
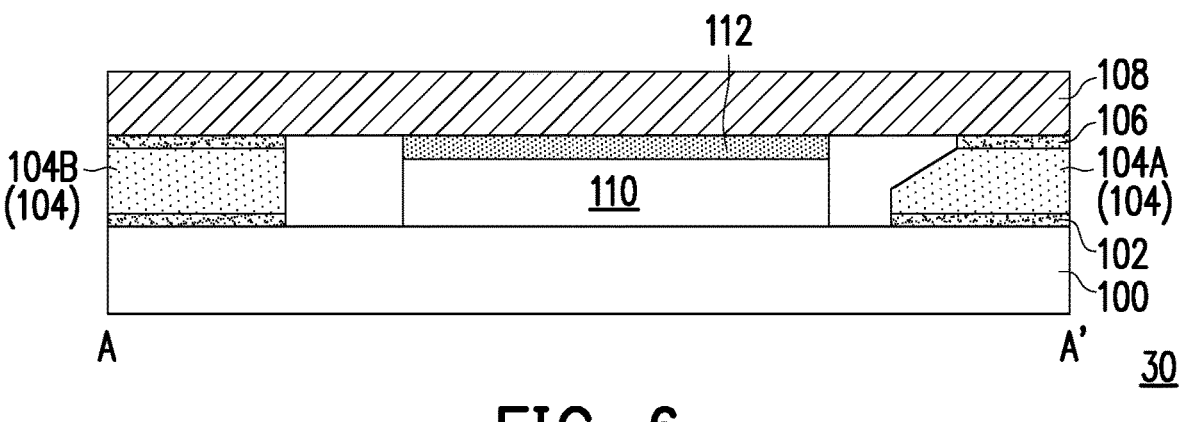
FIG. 6 is a cross-sectional view showing a package structure having a thermal interface material (TIM) in accordance with some embodiments.

FIG. 6 is a cross-sectional view showing a package structure having a thermal interface material (TIM) in accordance with some embodiments.

Referring to FIG. 6, a package structure 30 is similar to the package structure 20 of FIG. 5, but the package structure 30 includes a TIM 112 between the first die 110 and the lid layer 108 for heat dissipation. In detail, the TIM 112 is formed on the first die 110 before attaching the lid layer 108 on the stiffener ring 104. In some embodiments, the TIM 112 is formed from a material with higher thermal conductivity (k), such as Ag, Cu, Sn, In, carbon nanotube (CNT), graphite, or the like. In some embodiments, the thermal conductivity (k) of the TIM 112 is in a range of about 10 $Wm^{-1}K^{-1}$ to about 30 $Wm^{-1}K^{-1}$, such as about 10 $Wm^{-1}K^{-1}$. In some alternative embodiments, the TIM 112 is formed from another material, such as a polymer material, solder paste, indium solder paste, or the like. In some alternative embodiments, the thermal conductivity (k) of the TIM 112 is in a range of about 0.1 $Wm^{-1}K^{-1}$ to about 10 $Wm^{-1}K^{-1}$, such as about 5 $Wm^{-1}K^{-1}$.

In addition, although the second dies 120 are not illustrated in the cross-sectional view of FIG. 6, the TIM 112 is also formed on the second dies 120. In some embodiments, the first die 110 and the second dies 120 may trap heat to become hot spots in the package structure 30. Therefore, the TIM 112 thermally couples the dies 110/120 and the lid layer 108 to dissipate the heat from the dies 110/120 to the lid layer 108. Similar to the package structure 20 of FIG. 5, the package structure 30 also has the slant sidewall 105 facing the first sidewall 110*s*1 of the first die 110, so as to reduce the coupling area between the first portion 104A of the stiffener ring 104 and the lid layer 108, thereby avoiding the crack and/or delamination issue of the second adhesive layer 106. Accordingly, the reliability and the yield of the package structure 30 is improved.

Figure 7:
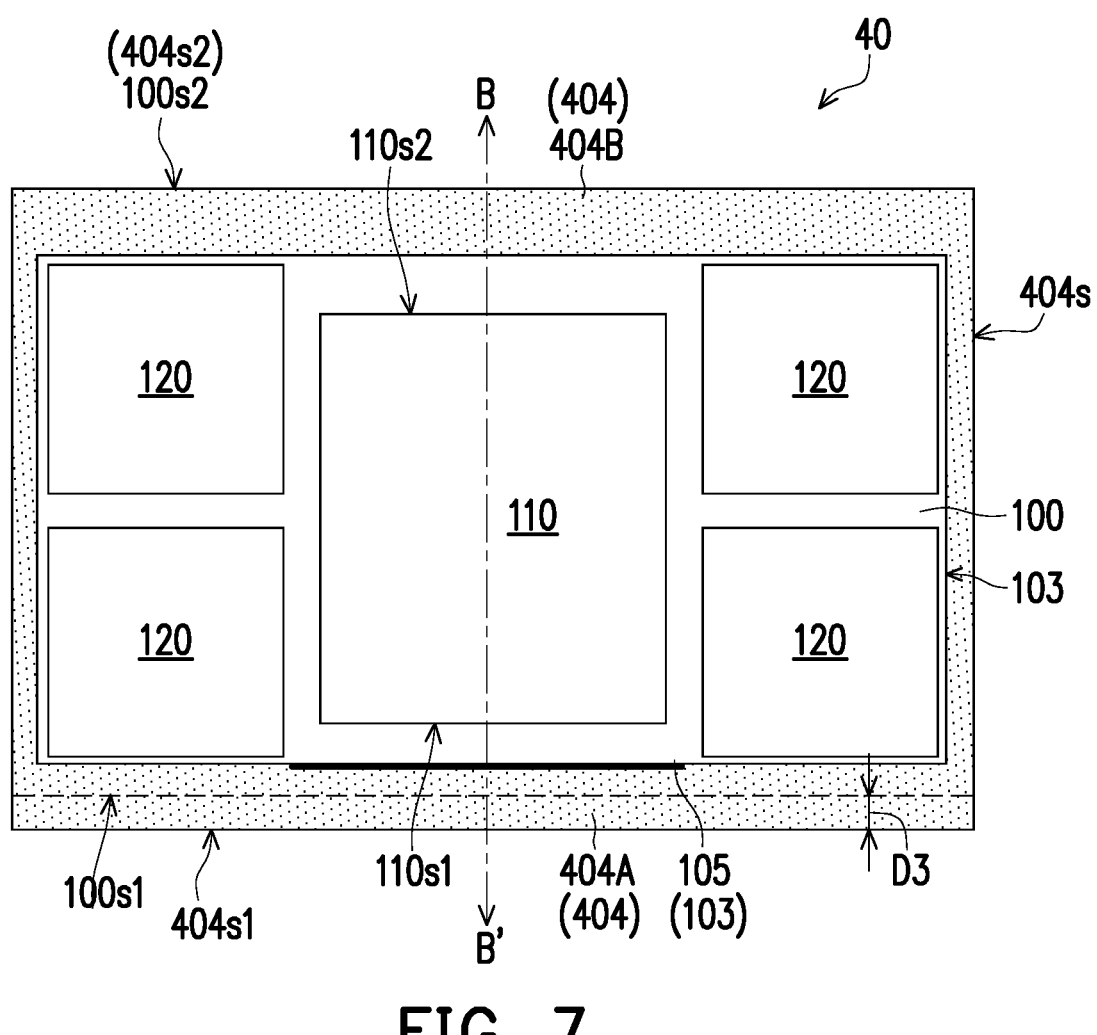
FIG. 7 is a top view showing a package structure in accordance with a second embodiment.
Figures 8, 9:
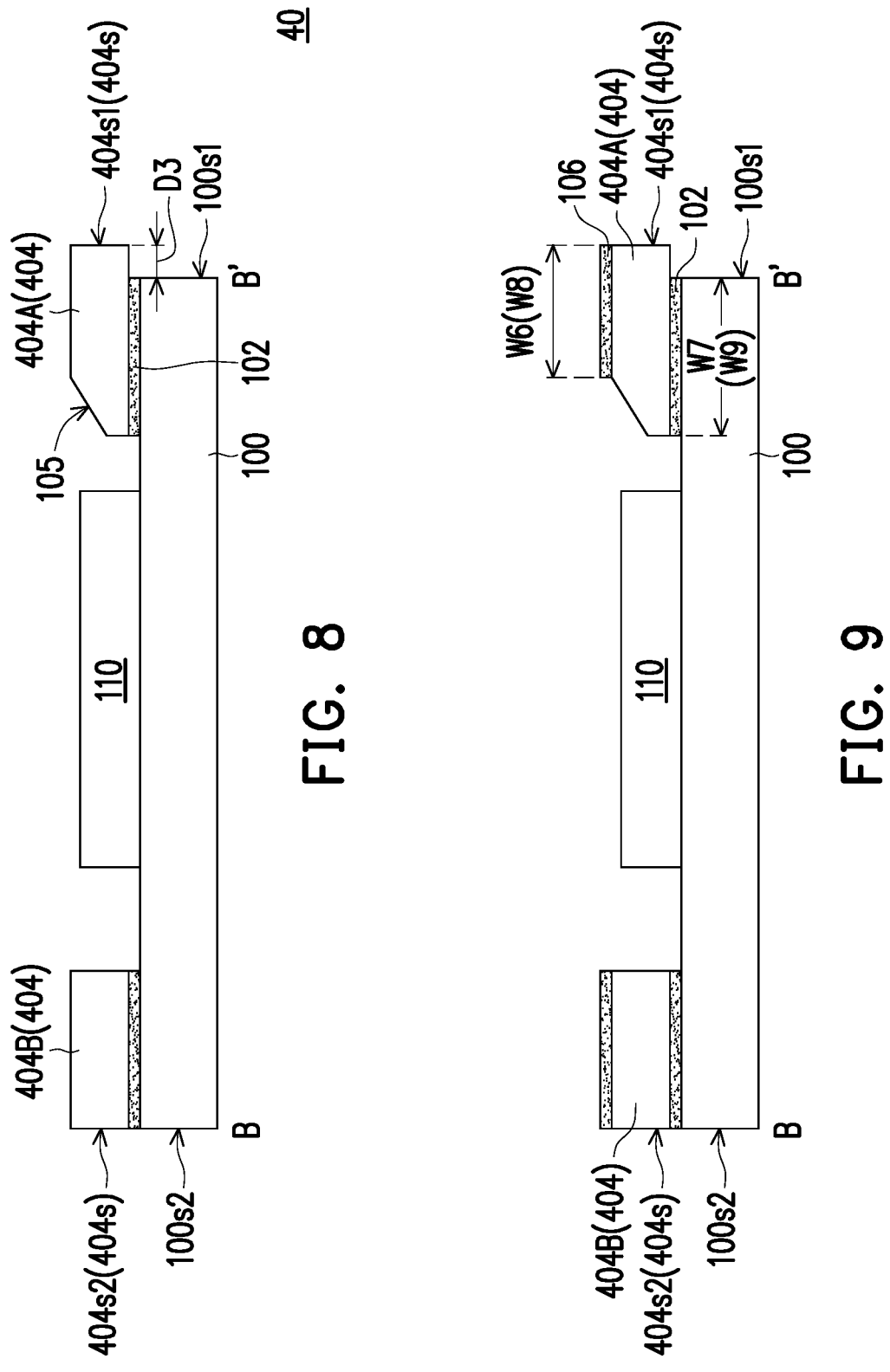
FIG. 8 is a cross-sectional view along a cross-section B-B' of FIG. 7.
FIG. 9 and FIG. 10 are cross-sectional views of a method of forming a package structure having a lid layer in accordance with some alternative embodiments.

FIG. 7 is a top view showing a package structure in accordance with a second embodiment. FIG. 8 is a cross-sectional view along a cross-section B-B' of FIG. 7.

Referring to FIG. 7, a package structure 40 is similar to the package structure 10 of FIG. 1, but the package structure 40 has a stiffener ring 404 protruding from the package substrate 100. Specifically, as shown in FIG. 8, the stiffener ring 404 is attached on the package substrate 100 by the first adhesive layer 102. The stiffener ring 404 may have an outer sidewall 404s opposite to the inner sidewall 103. The stiffener ring 404 may include a first portion 404A and a second portion 404B. The first portion 404A may be adjacent to the first sidewall 110s1 of the first die 110, and the second portion 404B may be adjacent to the second sidewall 110s2 of the first die 110 opposite to the first sidewall 110s1. The first portion 404A of the stiffener ring 404 may have a first outer sidewall 404s1 protruding from a sidewall 100s1 of the package substrate 100 by a distance D3. In some embodiments, the distance D3 is in a range of 0.1 µm to 3000 µm, such as 1200 µm. On the other hand, the second portion 404B of the stiffener ring 404 may have a second outer sidewall 404s2 aligned with a sidewall 100s2 of the package substrate 100. It should be noted that the first portion 404A of the stiffener ring 404 may overhang on the package substrate 100 to increase the flexibility of the first portion 404A, thereby relieving the stress on the first portion 404A. In this case, the crack and/or delamination issue of the adhesive layer 102/106 is avoided, thereby improving the reliability and the yield of the package structure 40 is improved.

Figures 10, 11:
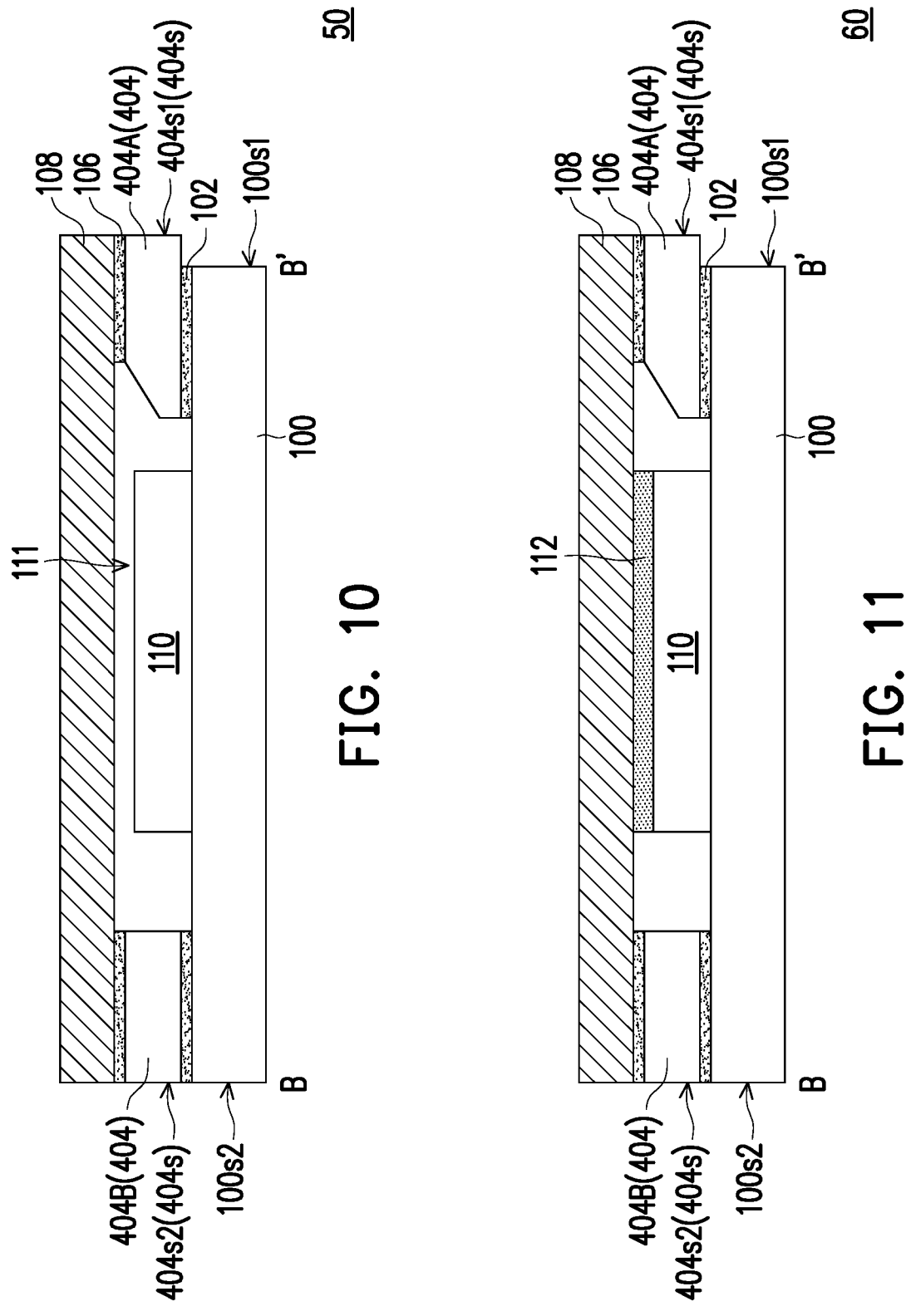
FIG. 11 is a cross-sectional view showing a package structure having a thermal interface material (TIM) in accordance with some alternative embodiments.

FIG. 9 and FIG. 10 are cross-sectional views of a method of forming a package structure having a lid layer in accordance with some alternative embodiments.

Referring to FIG. 9, continued from FIG. 8, after attaching the stiffener ring 404 on the package substrate 100 by the first adhesive layer 102, the second adhesive layer 106 is formed on the top surface 404t of the stiffener ring 404.

In some embodiments, since the first portion 404A of the stiffener ring 404 has the slant sidewall 105 and the first portion 404A protrudes from the package substrate 100, a width (or area) W6 of the top surface 404t of the first portion 404A is less than or substantially equal to a width (or area) W7 of the bottom surface 404bt of the first portion 404A. In this case, the second adhesive layer 106 on the first portion 404A may have a width (or area) W8 is less than or substantially equal to a width (or area) W9 of the first adhesive layer 102 between the first portion 404A and the package substrate 100. In some embodiments, the width W6 is substantially equal to the width W8, and the width W7 is substantially equal to the width W9.

Referring to FIG. 10, the lid layer 108 is adhered on the stiffener ring 404 by the second adhesive layer 106 to form a package structure 50. The lid layer 108 may overlay the first die 110 and the second dies 120. A gap 111 may be formed between the lid layer 108 and the first die 110. In the present embodiment, the lid layer 108 and the stiffener ring 404 have the same material with the same CTE to avoid the stress due to the CTE mismatch. It should be noted that FIG. 11 is a cross-sectional view showing a package structure having a thermal interface material (TIM) in accordance with some alternative embodiments.

Referring to FIG. 11, a package structure 60 is similar to the package structure 50 of FIG. 10, but the package structure 60 includes a TIM 112 between the first die 110 and the lid layer 108 for heat dissipation. In addition, although the second dies 120 are not illustrated in the cross-sectional view of FIG. 11, the TIM 112 is also formed on the second dies 120.

FIG. 12 to FIG. 17 are top views showing package structures in accordance with various embodiments.

Figure 12:
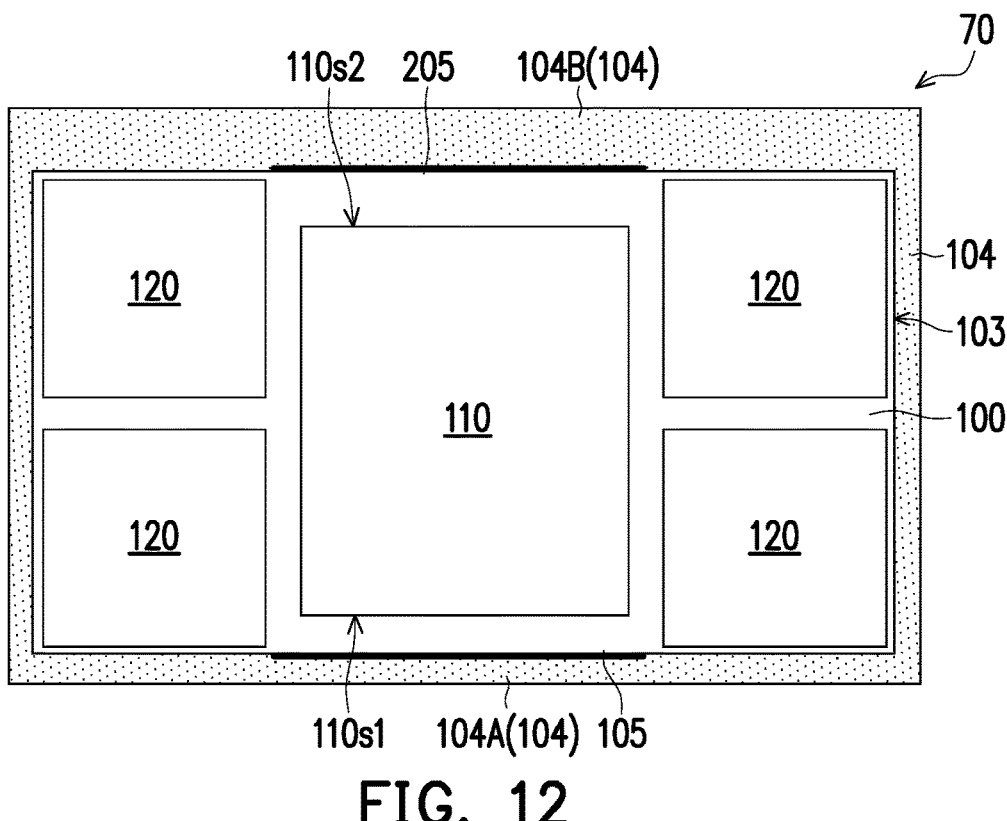
FIG. 12 to FIG. 17 are top views showing package structures in accordance with various embodiments.

Referring to FIG. 12, a package structure 70 is similar to the package structure 10 of FIG. 1, but the second portion 104B of the stiffener ring 104 of the package structure 70 also has a slant sidewall 205 facing the second sidewall 110s2 of the first die 110. That is, the slant sidewalls 105 and 205 is able to reduce the stress both at the first and second portions 104A and 104B, thereby prevent the crack and/or delamination issue of the adhesive layers both at the first and second portions 104A and 104B.

Figure 13:
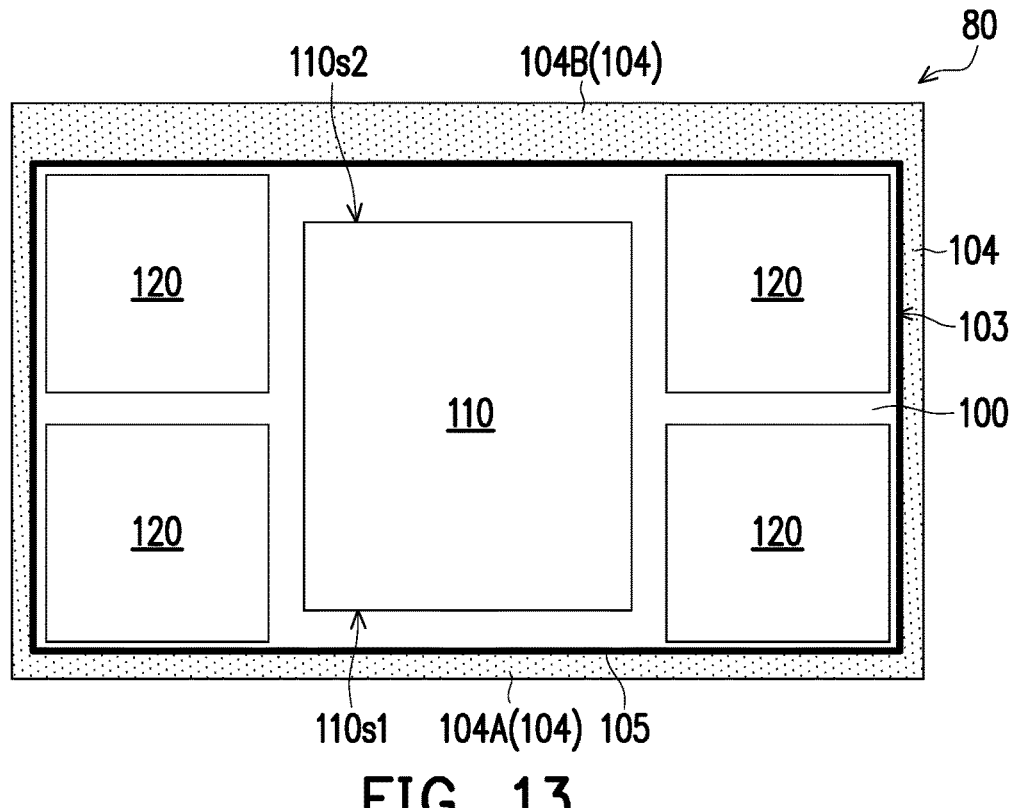

Referring to FIG. 13, a package structure 80 is similar to the package structure 10 of FIG. 1, but the slant sidewall 105 surrounds all sidewalls of the first die 110 and the second dies 120 along the inner sidewall 103. In such embodiment, the all-around slant sidewall 105 is able to comprehensively reduce the stress of the entire stiffener ring 104.

Figure 14:
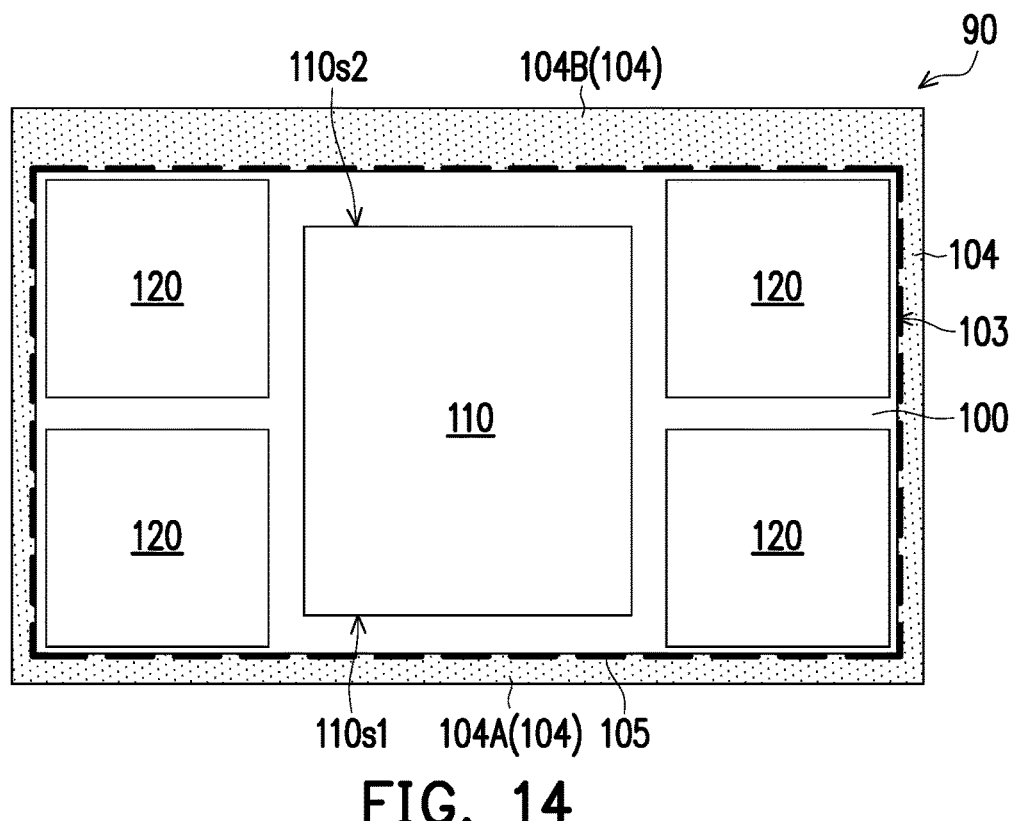
Figure 15:
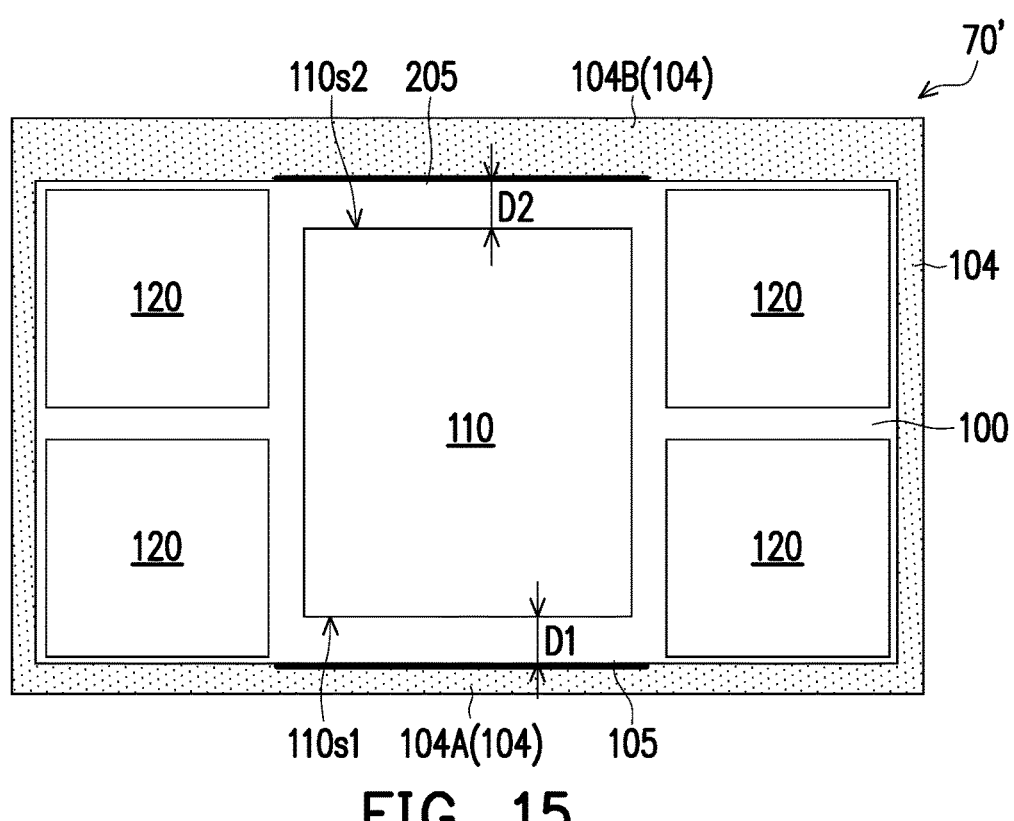
Figure 16:
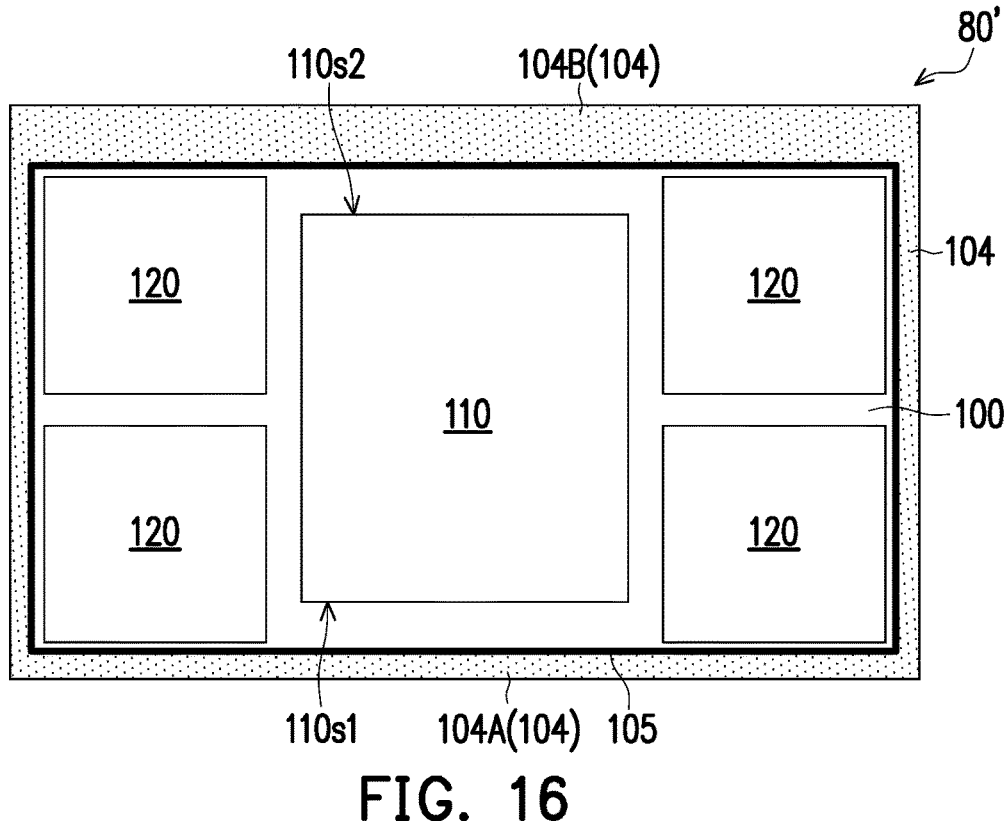
Figure 17:
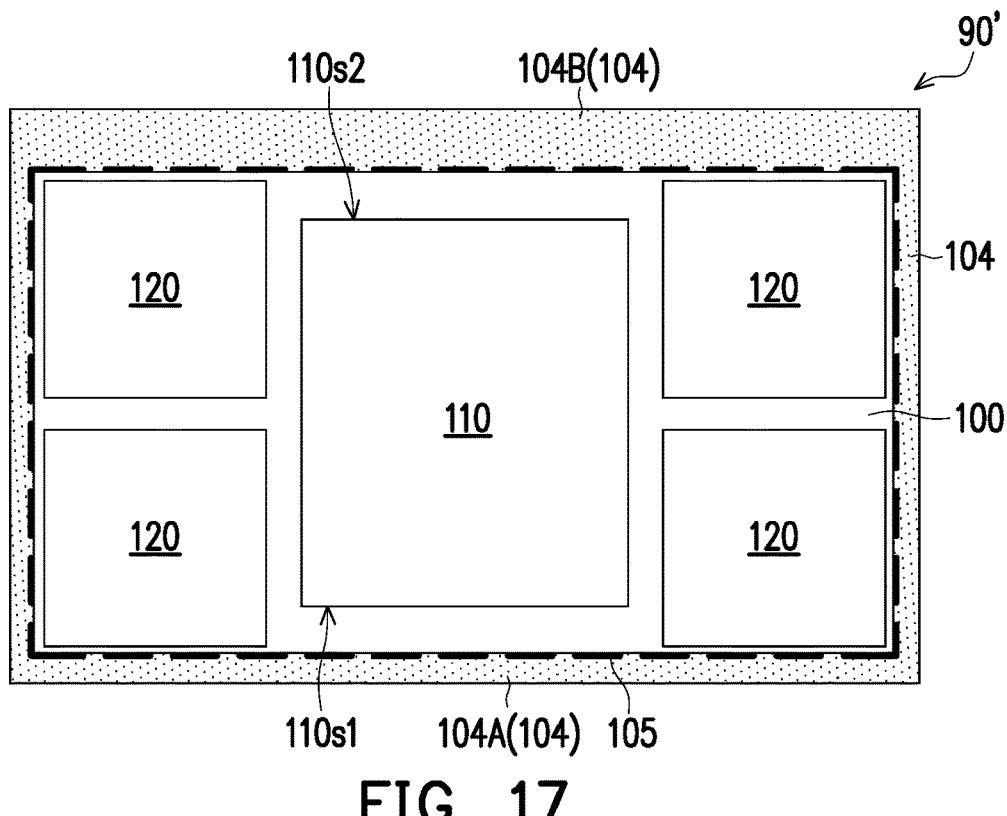

Although the slant sidewall 105 illustrated in FIG. 13 is a continuously slant (or inclined) structure, the embodiments of the present disclosure are not limited thereto. In other embodiments, a package structure 90 has a stiffener ring 104 with a slant sidewall 105 in which is a non-continuously inclined structure, as shown in FIG. 14. In some alternative embodiments, the slant sidewall 105 of the package structure 10, 40, or 70 with the continuously slant structure can also be replaced by the non-continuously inclined structure.

Further, the package structures 70, 80, and 90 of FIGS. 12-14 illustrates the first die 110 is an eccentric die offset from a center of the accommodation area AA. However, the embodiments of the present disclosure are not limited thereto. In some alternative embodiments, the first die 110 may be a non-eccentric die. That is, as shown in package structures 70', 80', and 90' of FIGS. 15-17, the first distance D1 between the first sidewall 110s1 of the first die 110 and the first portion 104A is substantially equal to the second distance D2 between the second sidewall 110s2 of the first die 110 and the second portion 104B. In such embodiment, whether the first die 110 is close to any side of the stiffener ring 104 or not, as long as a distance between the first die 110 and the stiffener ring 104 is close enough to cause excessive stress, the slant sidewall 105/205 is able to solve the crack or delamination issue of the adhesive layer 102/106, thereby improving the reliability and the yield of the package structures 70', 80', and 90'.

FIG. 18 illustrates a flow chart 1000 of a method of forming a package structure in accordance with some embodiments. While disclosed method 1000 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In some alternative embodiments, not all illustrated acts are required to implement one or more aspects or embodiments of the description herein. Further, one or more of the acts depicted herein may be carried out in one or more separate acts and/or phases. FIG. 18 may illustrate some embodiments of the method disclosed by FIG. 1, FIG. 2B, FIG. 4, FIG. 5, and FIG. 6.

Referring to FIG. 18, at block 1010, a first die and a plurality of second dies are mounted side by side on a package substrate. FIG. 1 and FIG. 2B illustrate the top view and the cross-sectional view corresponding to some embodiments corresponding to block 1010.

At block 1020, a stiffener ring is adhered on the package substrate by a first adhesive layer, and the first die and the plurality of second dies are surrounded by the stiffener ring, wherein the stiffener ring has an inner sidewall facing the first die, and the inner sidewall at least has a slant sidewall facing the first sidewall of the first die. FIG. 1 and FIG. 2B illustrate the top view and the cross-sectional view corresponding to some embodiments corresponding to block 1020.

At block 1030, a lid layer is adhered on the stiffener ring by a second adhesive layer, so that the lid layer overlays the first die and the plurality of second dies. FIG. 4 and FIG. 5 illustrate the cross-sectional views corresponding to some embodiments corresponding to block 1030.

At block 1040, a thermal interface material (TIM) is formed between the first die and the lid layer, so that the first die is coupled to the lid layer by the TIM. FIG. 6 illustrates the cross-sectional views corresponding to some embodiments corresponding to block 1040.

In accordance with an embodiment, a package structure includes a package substrate, a first die, and a stiffener ring. The first die is disposed on the package substrate and has a first sidewall and a second sidewall opposite to each other. The stiffener ring is disposed on the package substrate to surround the first die. The stiffener ring has an inner sidewall facing the first die, and the inner sidewall at least has a slant sidewall facing the first sidewall of the first die.

In accordance with an embodiment, a package structure includes a substrate, a stiffener ring, and an eccentric die. The stiffener ring is disposed on the substrate, wherein the stiffener ring has an inner perimeter to enclose an accommodation area. The eccentric die is disposed within the accommodation area on the substrate. The eccentric die is offset from a center of the accommodation area to close to a portion of the stiffener ring having an inclined sidewall.

In accordance with an embodiment, a package structure includes a package substrate, a first die, and a stiffener ring. The first die is disposed on the package substrate and having a first sidewall and a second sidewall opposite to each other. The stiffener ring is disposed on the package substrate to surround the first die. The stiffener ring includes a first portion adjacent to the first sidewall of the first die, and the first portion has a top area less than a bottom area thereof.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
a package substrate;
a first die, disposed on the package substrate and having a first sidewall and a second sidewall opposite to each other; and
a stiffener ring, disposed on the package substrate to surround the first die, wherein the stiffener ring comprises:

a first portion, adjacent to the first sidewall of the first die; and
a second portion, adjacent to the second sidewall of the first die, wherein an inner sidewall of the first portion has a slant sidewall facing the first sidewall, and an inner sidewall of the second portion has no slant sidewall facing the second sidewall;
a lid layer, adhered on the stiffener ring by a second adhesive layer, and overlying the first die; and
a first thermal interface material (TIM) disposed only between a top surface of the first die and a bottom surface of the lid layer.

2. The package structure of claim 1, wherein the inner sidewall of the second portion has a vertical sidewall facing the second sidewall of the first die.

3. The package structure of claim 2, wherein a first distance between the first sidewall of the first die and the slant sidewall of the first portion is less than or equal to a second distance between the second sidewall of the first die and the vertical sidewall of the second portion.

4. The package structure of claim 1, wherein the slant sidewall connects a top surface and a bottom surface of the stiffener ring, and an angle between the slant sidewall and the bottom surface is an acute angle.

5. The package structure of claim 1, wherein the slant sidewall comprises a flat surface, a curved surface, or a staircase surface.

6. The package structure of claim 1, wherein the first portion has a top width less than a top width of the second portion.

7. The package structure of claim 1, further comprising:
a plurality of second dies, side by side disposed on the package substrate, wherein the first die is disposed between the plurality of second dies;
a first adhesive layer, disposed between the stiffener ring and the package substrate;
a second adhesive layer, disposed on the stiffener ring; and
the lid layer, further overlying the plurality of second dies.

8. The package structure of claim 7, further comprising:
a second TIM disposed between the plurality of second dies and the lid layer.

9. The package structure of claim 1, wherein the stiffener ring has an outer sidewall opposite to the inner sidewall, and the outer sidewall protrudes from a sidewall of the package substrate.

10. A package structure, comprising:
a substrate;
a stiffener ring, disposed on the substrate, wherein the stiffener ring has an inner perimeter to enclose an accommodation area;
an eccentric die, disposed within the accommodation area on the substrate, wherein the eccentric die is offset from a center of the accommodation area to be close to a first portion of the stiffener ring having an inclined sidewall and away from a second portion of the stiffener ring without any inclined sidewall;
a lid layer, adhered on the stiffener ring by a second adhesive layer, and overlying the eccentric die; and
a first thermal interface material (TIM) disposed only between a top surface of the eccentric die and a bottom surface of the lid layer.

11. The package structure of claim 10, wherein the inclined sidewall of the stiffener ring comprises a continuously inclined structure or a non-continuously inclined structure.

12. The package structure of claim 10, further comprising:

a plurality of package dies, side by side disposed on the substrate, wherein the eccentric die is disposed between the plurality of package dies;

a first adhesive layer, disposed between the stiffener ring and the package substrate;

a second adhesive layer, disposed on the stiffener ring; and the lid layer, further overlying the plurality of package dies.

13. The package structure of claim 12, further comprising: a second TIM disposed between the plurality of package dies-and the lid layer.

14. The package structure of claim 12, wherein the eccentric die has a coefficient of thermal expansion (CTE) less than a CTE of the plurality of package dies.

15. A package structure, comprising:

a package substrate;

a first die, disposed on the package substrate and having a first sidewall and a second sidewall opposite to each other;

a stiffener ring, disposed on the package substrate to surround the first die, wherein the stiffener ring comprises a first portion adjacent to the first sidewall of the first die and a second portion adjacent to the second sidewall of the first die, wherein the first portion has a topmost area less than a bottommost area thereof, and the second portion has a topmost area substantially equal to a bottommost area thereof;

a lid layer, adhered on the stiffener ring by a second adhesive layer, and overlying the first die; and a first thermal interface material (TIM) disposed only between a top surface of the first die and a bottom surface of the lid layer.

16. The package structure of claim 15, wherein a first distance between the first sidewall of the first die and the first portion is less than a second distance between the second sidewall of the first die and the second portion.

17. The package structure of claim 15, further comprising:

a plurality of second dies, side by side disposed on the package substrate, wherein the first die is disposed between the plurality of second dies;

a first adhesive layer, disposed between the stiffener ring and the package substrate;

a second adhesive layer, disposed on the stiffener ring, wherein the second adhesive layer has an area less than an area of the first adhesive layer; and the lid layer, further overlying the plurality of second dies.

18. The package structure of claim 17, further comprising: a second TIM disposed between the plurality of second dies and the lid layer.

19. The package structure of claim 15, wherein the bottommost area of the first portion and the bottommost area of the second portion is at the same level.

20. The package structure of claim 15, wherein an inner sidewall of the first portion has a slant sidewall facing the first sidewall, and an inner sidewall of the second portion has no slant sidewall facing the second sidewall.

* * * * *